(12) United States Patent
Matsuura et al.

(10) Patent No.: US 6,897,097 B2
(45) Date of Patent: May 24, 2005

(54) SEMICONDUCTOR DEVICE AND A METHOD OF MANUFACTURING THE SAME

(75) Inventors: Takao Matsuura, Kawanishi (JP); Yoshihiko Yamaguchi, Iide (JP); Shouichi Kobayashi, Yonezawa (JP); Kouji Tsuchiya, Kaminoyama (JP)

(73) Assignees: Hitachi, Ltd., Tokyo (JP); Hitachi Yonezawa Electronics Co., Ltd., Yamagata (JP)

( * ) Notice: Subject to any disclaimer, the term of this patent is extended or adjusted under 35 U.S.C. 154(b) by 0 days.

(21) Appl. No.: 10/669,564

(22) Filed: Sep. 25, 2003

(65) Prior Publication Data

US 2004/0058479 A1 Mar. 25, 2004

Related U.S. Application Data

(63) Continuation of application No. 10/108,439, filed on Mar. 29, 2002, now Pat. No. 6,667,193, which is a continuation of application No. 10/108,483, filed on Mar. 29, 2002, now Pat. No. 6,590,276, which is a continuation of application No. 09/733,929, filed on Dec. 12, 2000, now Pat. No. 6,399,423.

(30) Foreign Application Priority Data

Dec. 27, 1999 (JP) ............................................ 11-371260

(51) Int. Cl.$^7$ ........................... H01I 21/44; H01I 21/48; H01L 21/50
(52) U.S. Cl. ...................................................... 438/123
(58) Field of Search ................................ 438/123, 106, 438/107, 124, 125, 126, 127, 26, 51, 55, 64, 68, 111, 112, 113, 611, 612, 613, 460, 461

(56) References Cited

U.S. PATENT DOCUMENTS

| 5,026,669 | A | | 6/1991 | Shinohara |
| 5,327,104 | A | | 7/1994 | Kikushima |
| 5,731,231 | A | | 3/1998 | Miyajima |
| 5,973,395 | A | | 10/1999 | Suzuki et al. |
| 6,208,020 | B1 | * | 3/2001 | Minamio et al. ........... 257/684 |
| 6,399,423 | B2 | | 6/2002 | Matsuura et al. |

FOREIGN PATENT DOCUMENTS

| JP | 2-240940 | 9/1990 |
| JP | 11-195743 | 7/1999 |

OTHER PUBLICATIONS

"Semiconductor Assembling/Testing Technique of '99", Extra Issue of Monthly Semiconductor World, Jul. 27, 1998.

* cited by examiner

*Primary Examiner*—David Nhu
(74) *Attorney, Agent, or Firm*—Mattingly, Stanger, Malur & Brundidge, P.C.

(57) ABSTRACT

The semiconductor device comprises: a tub for supporting a semiconductor chip; a sealing body formed by sealing the semiconductor chip with a resin; a plurality of leads made of a copper alloy, exposed to the back face of the sealing body, and having a soldered layer on the exposed mounted face; and wires for connecting the pads of the semiconductor chip and the corresponding leads. In the manufacture method, the sealing body is polished, after resin-molded, at its back face with a brush to form the two widthwise edge portions, as exposed from the back face of the sealing body, of the lead into rounded faces, and the mounted face of the lead including the rounded faces is protruded at its central portion from the back face of the sealing body thereby to improve the connection reliability at the packaging time.

10 Claims, 12 Drawing Sheets

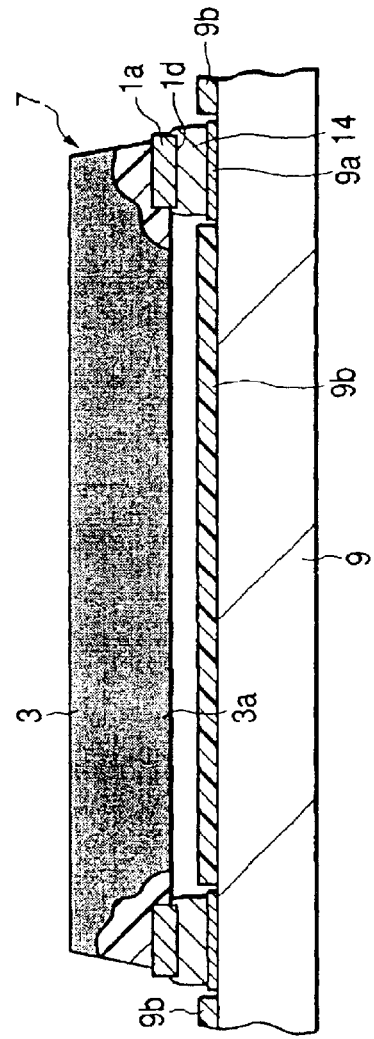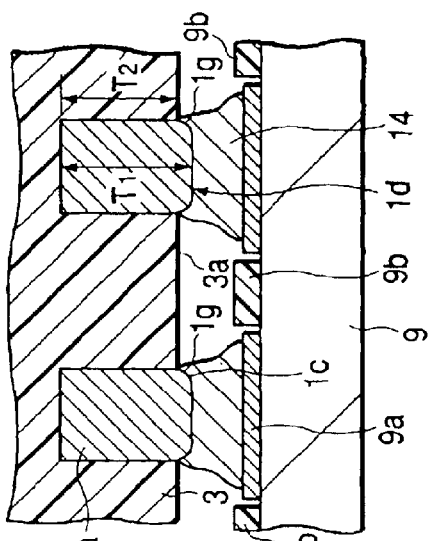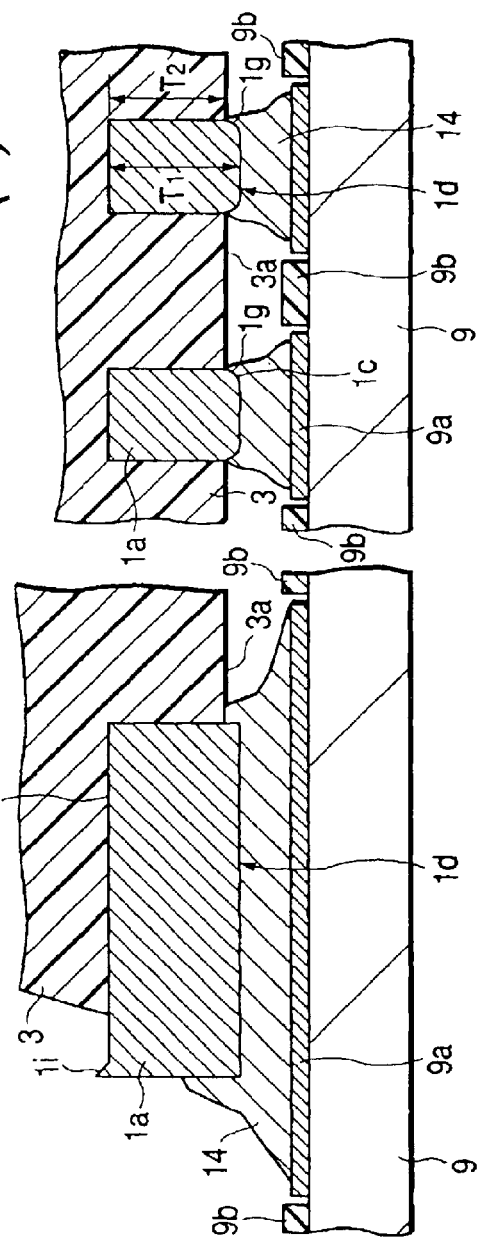

(VACUUM SUCTION)

ROTATION

SEMICONDUCTOR DEVICE AND A METHOD OF MANUFACTURING THE SAME

This is a continuation application of U.S. Ser. No 10/108, 439, filed Mar. 29, 2002 now U.S. Pat. No. 6,667,193, which is a continuation application of U.S. Ser. No. 10/108,483, filed Mar. 29, 2002 (now U.S. Pat. No. 6.590,276). which is a continuation application of U.S. Ser. No. 09/733,929, filed Dec. 12, 2000 (now U.S. Pat. No. 6,399,423).

FIELD OF THE INVENTION

The present invention relates to a semiconductor manufacturing technique and, more particularly, to a technique which is effective when applied to an improvement in the connection reliability at the time of mounting a surface mount type semiconductor device.

DESCRIPTION OF THE RELATED ART

The technique to be explained has been examined by us when we investigated and completed the invention, as will be summarized in the following.

One resin-sealed type semiconductor device, as intended to reduce the size, is exemplified by a semiconductor package called the "QFN" (Quad Flat Non-leaded Package).

The QFN is a surface mount in which a plurality of thin leads arranged around a tub supporting a semiconductor chip are arranged on the back face (i.e., the face on the semi-conductor device mounting side) of a sealing body, and has a single-face molding structure which uses a lead frame having only one resin-molded face.

In the QFN, the individual leads are arranged on the back face of the sealing body so that a packaging area (of the connecting region) has been retained for mounting the leads with a solder on the mount substrate.

Therefore, the QFN is molded with a film sheet so that burrs (such as resin burr of a leakage resin or resin flush, as will be called the "resin burr") of a molding resin may not be formed on the leads on the back face of the sealing body (although this molding method will be called the "laminate molding method").

At the molding time, more specifically, the film sheet is held in close contact with the back face of the sealing body in the cavity of the molding die, so that the resin burr may be prevented from sticking to the leads on the back face of the sealing body.

Here, the structure of the QFN is described, for example, on pages 56 and 57 of "Semiconductor Assembling/Testing Technique of '99, Extra Issue of 1998 of Monthly Semiconductor World 1998", issued on Jul. 27, 1998 by Kabushiki Gaisha PRESS JOURNAL".

SUMMARY OF THE INVENTION

In the QFN of the technique thus far described, however, the stand-off height at the packaging time is made substantially as small as the plated thickness by its structure. Therefore, the solder wettability at the QFN packaging time is seriously deteriorated if the resin burr is formed In the vicinity of the leads on the back face of the sealing body.

In the QFN, moreover, leads 1a may be deformed toward the side of a semiconductor chip 2, as exemplified in the comparison of FIG. 19A, by the influence such as the resin charging pressure at the molding time. As in a QFN 25 of the comparison of 19B, a resin burr 16 such as the resin flash is then easily formed on the lower side (or back side) of the deformed lead 1a.

This resin burr 16 raises a problem that it can hardly be removed by the well-known deburring method such as the high-pressure water method or the liquid honing method.

In the semiconductor package having the single-face molding structure such as the QFN, on the other hand, the laminate molding method may be performed. Even with this laminate molding method, however, it is difficult to eliminate the resin burr completely. Another problem is that it takes a cost to make a modification into the laminate molding apparatus.

Where the QFN is molded by the laminate molding method, moreover, the molding resin charged between the leads may be wrinkled to form protrusions of the film sheet. These protrusions obstruct the lead clamping in the cutting die at the lead cutting time thereby to cause a problem that the leads are cut to become defective.

Here at the lead cutting step, the leads are pressed and cut downward (in the direction of the face on the side opposed to the mounted face) by the cutting punch (or cutting blade). Then, the lead burr is formed on the lower side (or on the mounted side) of the leads to cause the defective connection at the QFN packaging time thereby to raise a problem that the connection reliability is lowered.

On the other hand, the QFN is troubled by another problem that the materials of the individual components are deformed by the heat at the working time so that they cannot retain their flatnesses.

In the manufacture of the QFN, there is another problem that the facial pressure on the molding die has to be strictly managed so as to prevent the back face of the sealing body from having the resin burr.

At this time, another problem is that the molding die has to be frequently cleaned.

On the other hand, the technique for exposing the leads to the back face of the semiconductor device by polishing the back side is described in Japanese Patent Laid-Open No. 195743/99 and 240940/90. However, the former has no description on the semiconductor device having the single-face molding structure. The latter is directed to the technique for separating an integral lead into individual leads by polishing the back face side of the semiconductor device, but does not have any description on the semiconductor device in the state where the inner portions of the adjoining leads are separated in advance.

An object of the invention is to provide a semiconductor device for improving the connection reliability at a packaging time, and a method of manufacturing the same.

Another object of the invention is to provide a semiconductor device intended to facilitate the process management, and a method of manufacturing the same.

The aforementioned and other objects and novel features of the invention will become apparent from the following description to be made with reference to the accompanying drawings.

The representative of the invention disclosed herein will be briefly described in the following.

According to an aspect of the invention, there is provided a resin-sealed type semiconductor device comprising: a tub for supporting a semiconductor chip; a sealing body formed by sealing the semiconductor chip with a resin; a plurality of leads arranged around the tub and exposed to the face of the sealing body on the semiconductor device mounting side; and connecting members for connecting the surface electrodes of the semiconductor chip and the corresponding ones of the leads. The two widthwise edge portions of each of the leads are formed of rounded faces, and the mounted face of the lead including the rounded faces is protruded at its central portion from the face of the sealing body on the semiconductor device mounting side.

According to another aspect of the invention, there is provided a method of manufacturing a resin-sealed type semiconductor device, comprising the steps of: preparing a lead frame in which a plurality of leads are arranged around a tub for supporting a semiconductor chip; bonding the tub and the semiconductor chip; connecting the surface electrodes of the semiconductor chip and the corresponding ones of the leads by connecting members; forming a sealing body by resin-sealing the semiconductor chip and the connecting members on the lead frame on the semiconductor chip arranging side, to arrange the plurality of leads on the face of the semiconductor device mounting side; exposing the plurality of leads by polishing the face of the sealing body on the semiconductor device mounting side; and separating the plurality of leads from the frame portion of the lead frame.

According to the invention, the connection regions of the leads needed at the time of mounting the semiconductor device on the mount substrate can be reliably exposed to improve the connection reliability at the time of packaging the semiconductor device.

According to still another aspect of the invention, there is provided a method of manufacturing a resin-sealed type semiconductor device, comprising the steps of: preparing a lead frame in which a plurality of leads are arranged around a tub for supporting a semiconductor chip; bonding the tub and the semiconductor chip; connecting the surface electrodes of the semiconductor chip and the corresponding ones of the leads by connecting members; forming a sealing body by resin-sealing the semiconductor chip and the connecting members on the lead frame on the semiconductor chip arranging side, to arrange the plurality of leads on the face of the semiconductor device mounting side with the individual inner portions of the adjoining ones of the leads being separated; exposing the plurality of leads by polishing the face of the sealing body on the semiconductor device mounting side; and cutting and separating the individual leads from the frame portion of the lead frame by pressing, after the lead frame is placed on a cutting die with the face of the sealing body on the semiconductor device mounting side being directed upward, the leads under pressure with the cutting blade of the cutting die from the side of the mounted face of the leads.

According to a further aspect of the invention, there is provided a method of manufacturing a resin-sealed type semiconductor device, comprising the steps of: preparing a lead frame which is made of a copper alloy and in which a plurality of leads are arranged around a tub for supporting a semiconductor chip; bonding the tub and the semiconductor chip; connecting the surface electrodes of the semiconductor chip and the corresponding ones of the leads by bonding wires; forming a sealing body by resin-sealing the semiconductor chip and the wires on the lead frame on the semiconductor chip arranging side, to arrange the plurality of leads on the face of the semiconductor device mounting side with the individual inner portions of the adjoining ones of the leads being separated; exposing the plurality of leads by polishing the face of the sealing body on the semiconductor device mounting side with a brush which is made of a polyamide resin having abrasive grain thereon; forming a soldered layer on the mounted faces of the leads, as exposed from the face on the semiconductor device mounting side; and cutting and separating the individual leads from the frame portion of the lead frame by pressing, after the lead frame is placed on a cutting die with the face of the sealing body on the semiconductor device mounting side being directed upward, the leads under pressure with the cutting blade of the cutting die from the side of the mounted face of the leads.

BRIEF DESCRIPTION OF THE DRAWINGS

Of FIGS. 4A to 4C showing one example showing the package state in which the QFN shown in FIG. 1 is mounted on a mount substrate: FIG. 4A is a sectional view of a portion; FIG. 4B is an enlarged sectional view, as taken in a lead longitudinal direction, of a portion of a soldered portion; and FIG. 4C is an enlarged sectional view, as taken in a lead transverse direction, of a portion of the soldered portion;

Of FIGS. 12A to 12C showing one example of the state of the matrix frame molded in the manufacture of the QFN shown in FIG. 1.

DESCRIPTION OF THE PREFERRED EMBODIMENTS

Figure 1:
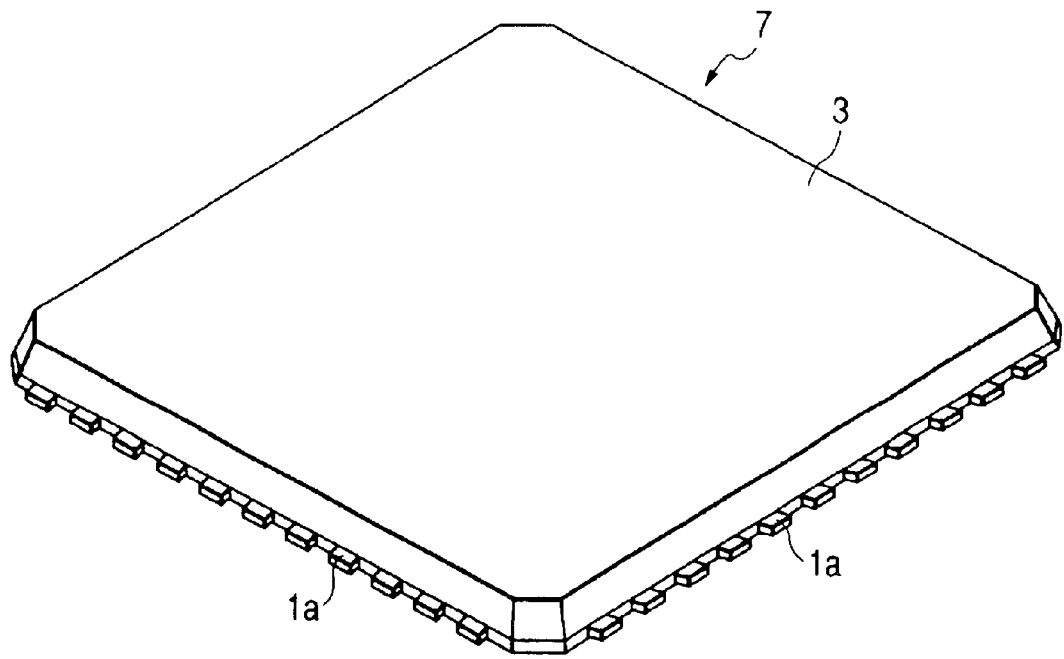
FIG. 1 is a perspective view showing one embodiment of the structure of a semiconductor device (QFN) according to the invention.

In the following embodiments, the description of identical or similar portions will not be repeated on principle, unless otherwise especially necessary.

Moreover, the following embodiments will be described, if needed for conveniences, by dividing them into a plurality of sections or modes, which are not independent of one another, unless otherwise explicitly specified so, but are partially or wholly in relations of modifications, details or supplementary explanations of others.

In the following embodiments, on the other hand, when reference is made to the number (including the numbers, numerical values, quantities and ranges) of elements, the invention should not be limited to the specific number, unless otherwise explicitly specified or apparently limited to that number, but may be more or less the specific number.

The embodiments of the invention will be described in detail with reference to the accompanying drawings. Here, throughout all the drawings for explaining the embodiments, parts having identical functions will be designated by common reference numerals, and their repeated descriptions will be omitted.

Figure 2:
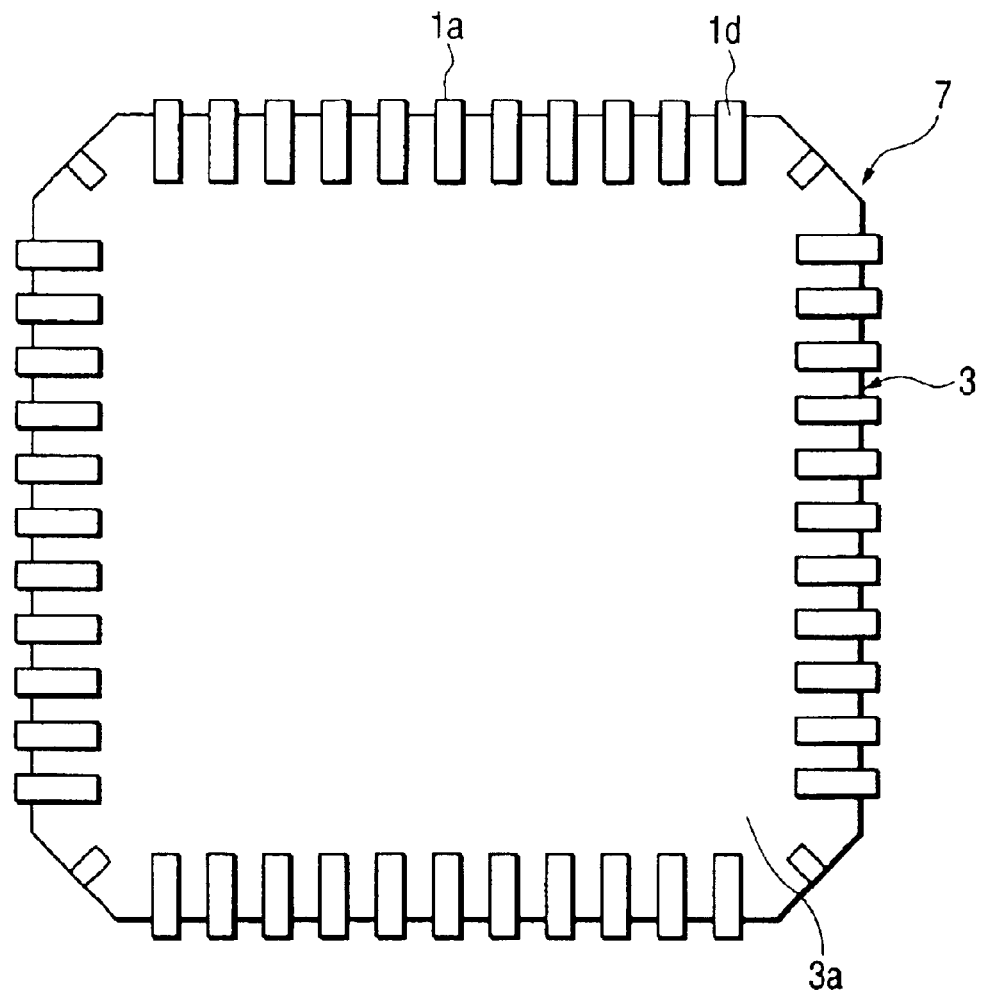
FIG. 2 is a bottom view showing the structure of the QFN shown in FIG. 1.
Figure 3:
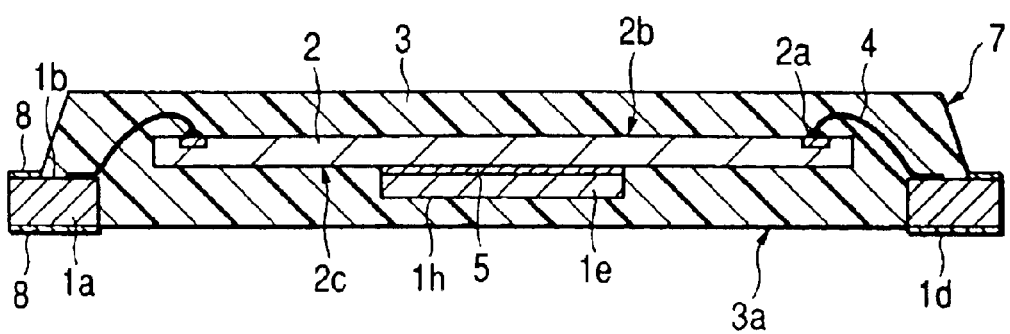
FIG. 3 is a sectional view showing the structure of the QFN shown in FIG. 1.
Figure 5:
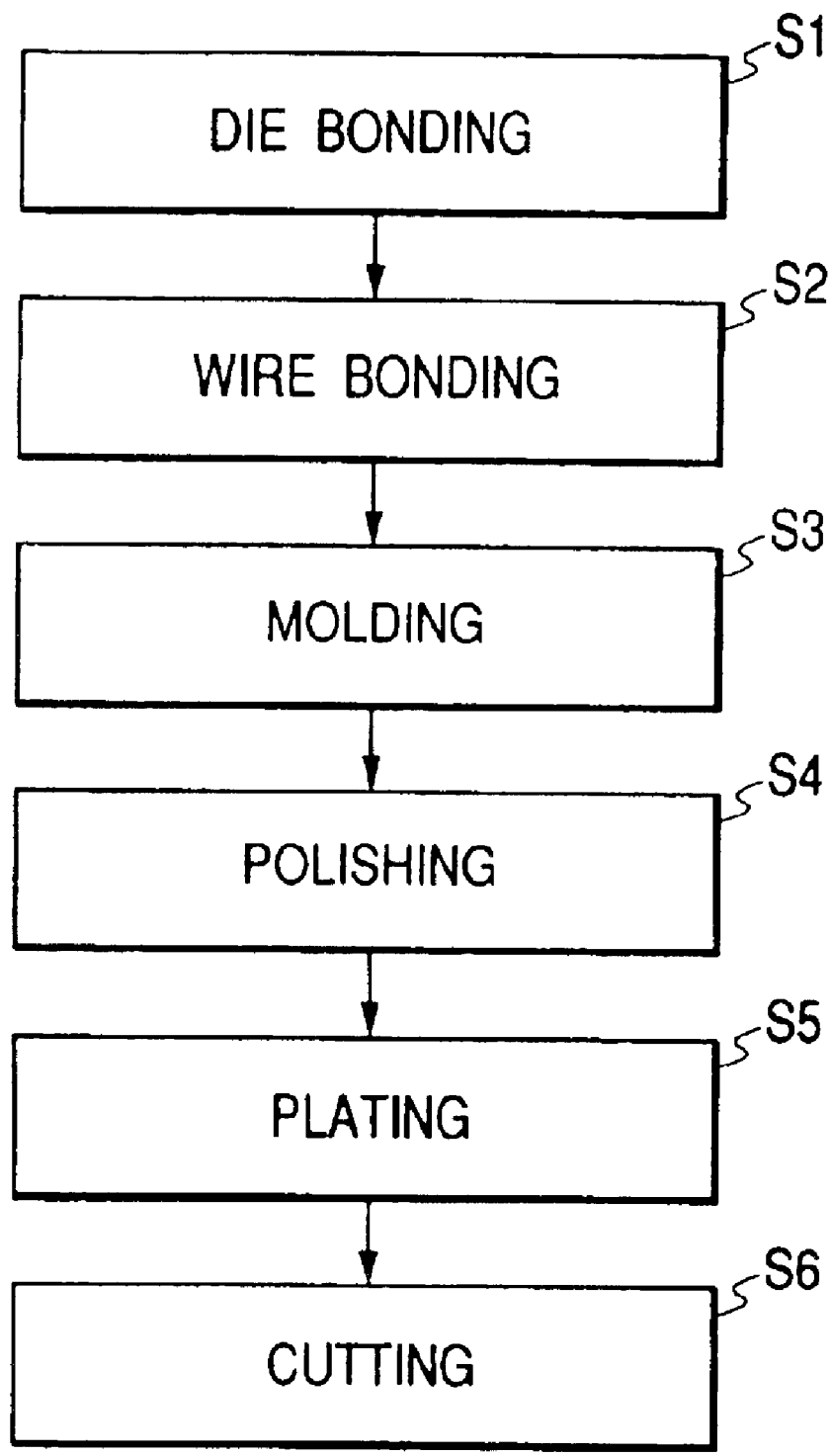
FIG. 5 is a flow chart showing a manufacture method of one example of an assembling procedure in a method of manufacturing the QFN shown in FIG. 1.
Figure 6A:
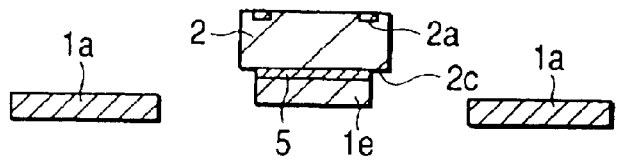
FIGS. 6A, 6B, 6C, 6D, 6E and 6F are sectional views showing one example of the structures of intermediates to be treated at the individual steps of the manufacture method shown in FIG. 5.
Figure 6B:
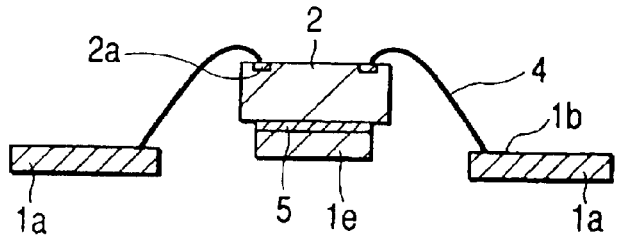
Figure 8:
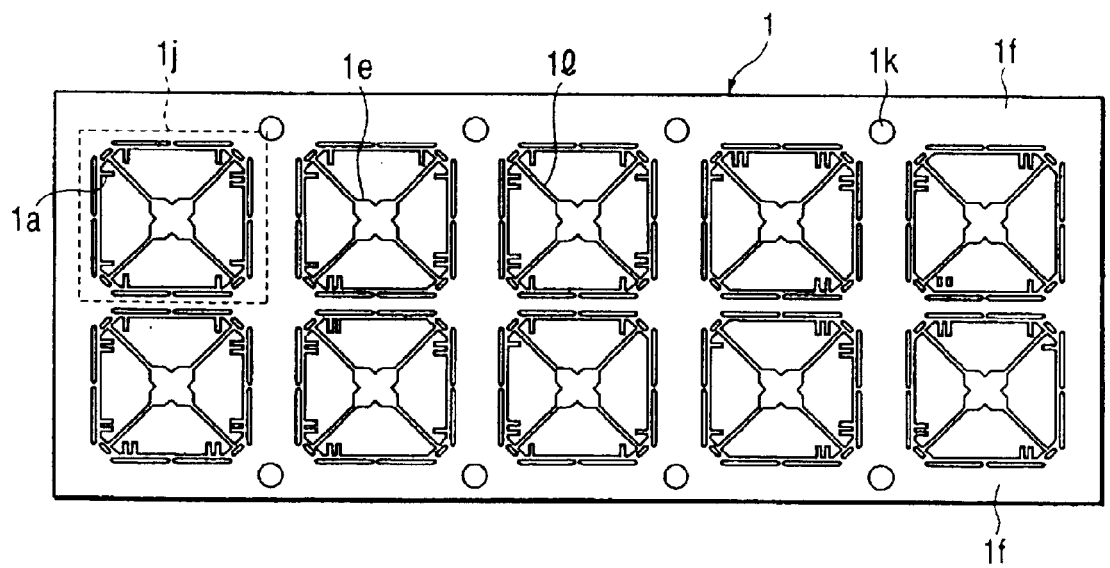
FIG. 8 is a top plan view showing the structure of a matrix frame or one example of a lead frame to be used for manufacturing the QFN shown in FIG. 1.
Figure 9:
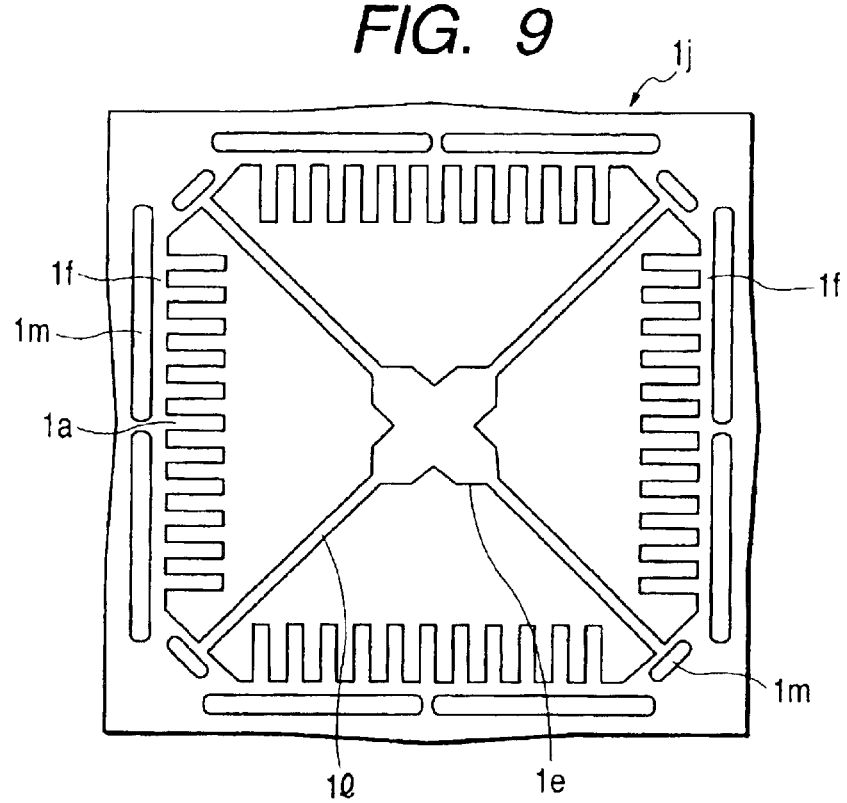
FIG. 9 is a top plan view showing a portion of one example of the structure of a unit lead frame in the matrix frame shown in FIG. 8.
Figure 10:
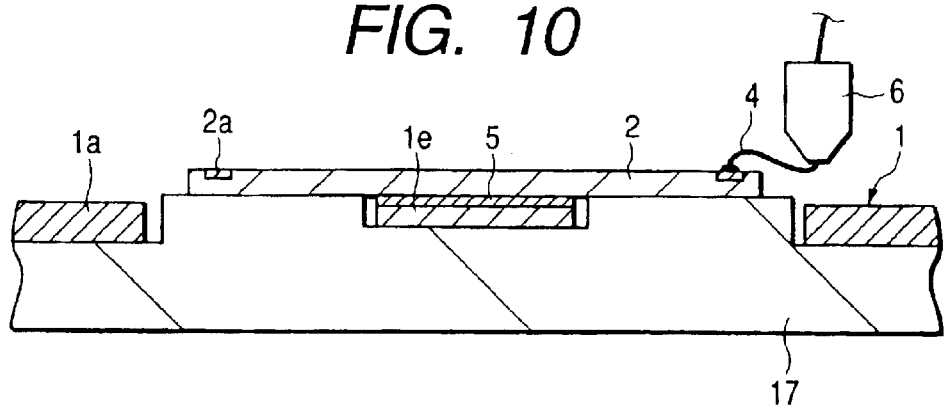
FIG. 10 is a sectional view showing a portion of one example of a wiring method in the wire bonding step of the manufacture of the QFN shown in FIG. 1.
Figure 11:
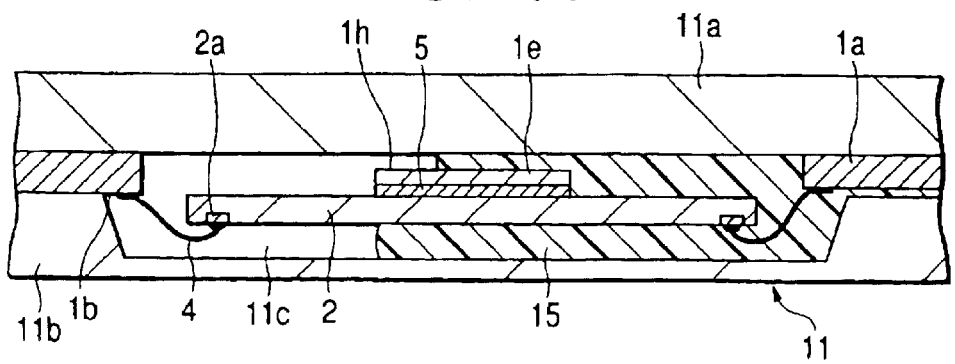
FIG. 11 is a sectional view showing a portion of one example of a molded state in the manufacture of the QFN shown in FIG. 1.
Figure 12A:
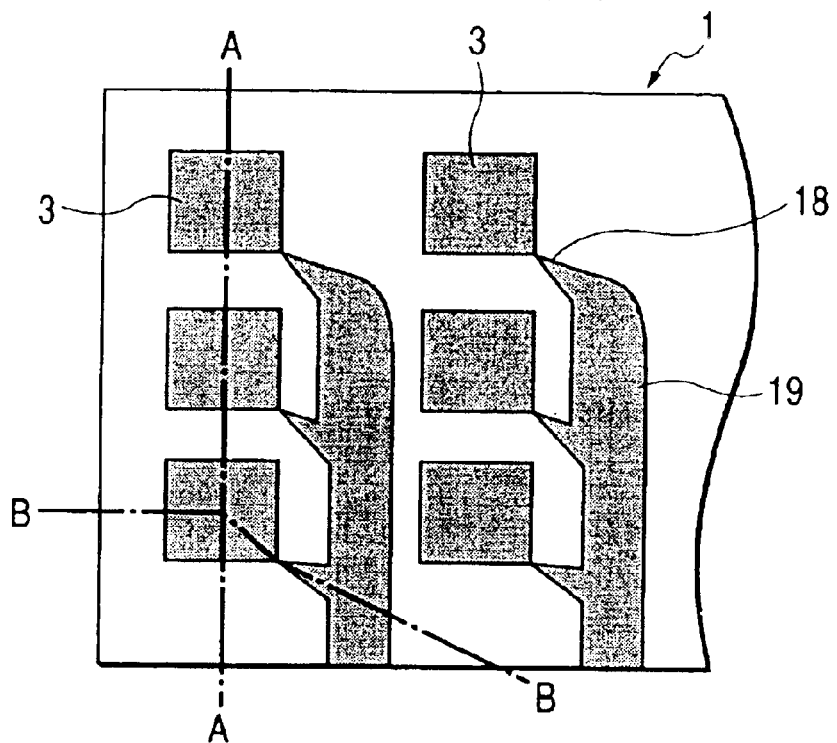
FIG. 12A is an enlarged top plan view showing a portion.
Figure 12B:
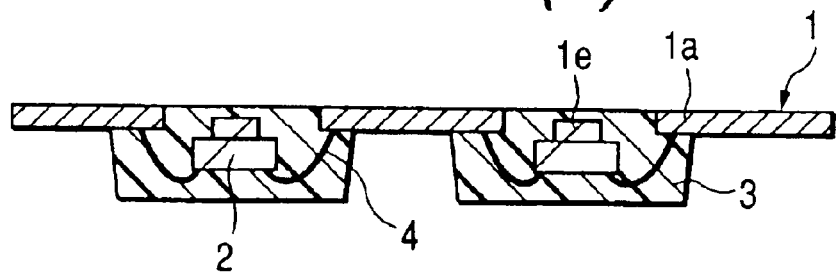
FIG. 12B is a sectional view taken along line A—A of FIG. 12A.
Figure 12C:
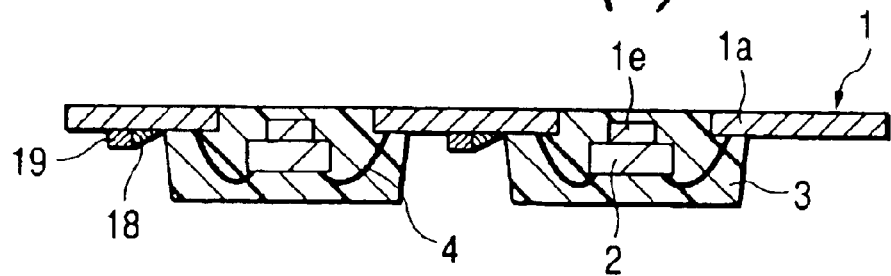
FIG. 12C is a sectional view taken along line B—B of FIG. 12A.
Figure 13:
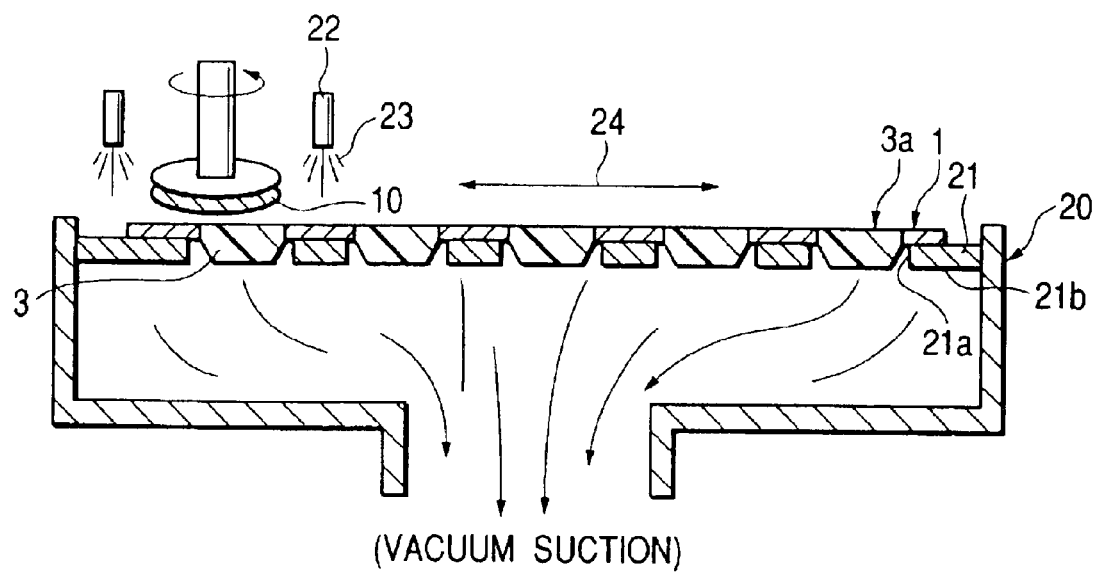
FIG. 13 is a sectional view showing a portion of one example of the polished sate in which a sealing body is polished on its back face in the manufacture of the QFN shown in FIG. 1.
Figure 14:
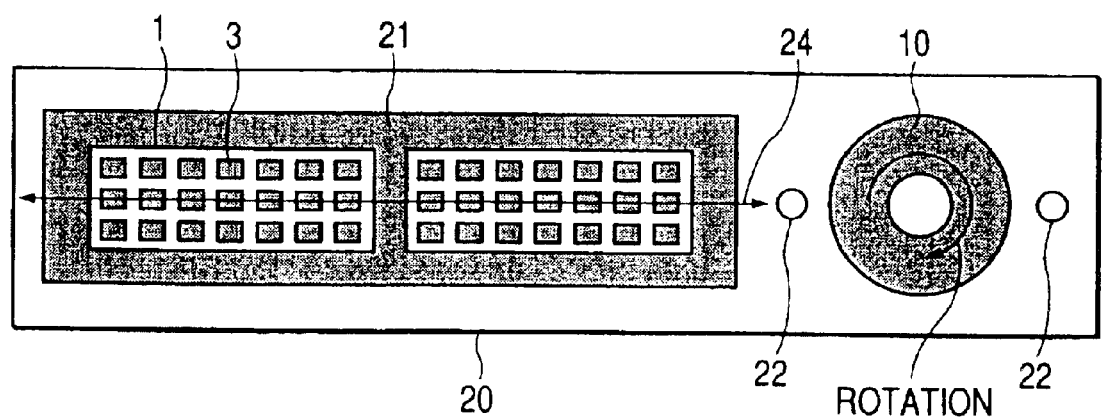
FIG. 14 is a top plan view showing the example of the polished sate in which the sealing body is polished on its back face in the manufacture of the QFN shown in FIG. 1.

FIG. 1 is a perspective view showing one embodiment of the structure of a semiconductor device (QFN) according to the invention; FIG. 2 is a bottom view showing the structure of the QFN shown in FIG. 1; FIG. 3 is a sectional view showing the structure of the QFN shown in FIG. 1; Of FIGS. 4A to 4C showing one example showing the package state in which the QFN shown in FIG. 1 is mounted on a mount substrate: FIG. 4A is a sectional view of a portion; FIG. 4B is an enlarged sectional view, as taken in a lead longitudinal direction, of a portion of a soldered portion; and FIG. 4C is an enlarged sectional view, as taken in a lead transverse direction, of a portion of the soldered portion; FIG. 5 is a flow chart showing a manufacture method of one example of an assembling procedure in a method of manufacturing the QFN shown in FIG. 1; FIGS. 6A, 6B, 6C, 6D, 6E and 6F are sectional views showing one example of the structures of intermediates to be treated at the individual steps of the manufacture method shown in FIG. 5; FIG. 7 is a sectional view showing one example showing the state in which a resin burr is formed on the back face of a sealing body after the molding step of the manufacture method of the QFN shown in FIG. 1; FIG. 8 is a top plan view showing the structure of a matrix frame or one example of a lead frame to be used for manufacturing the QFN shown in FIG. 1; FIG. 9 is a top plan view showing a portion of one example of the structure of a unit lead frame in the matrix frame shown in FIG. 8; FIG. 10 is a sectional view showing a portion of one example of a wiring method in the wire bonding step of the manufacture of the QFN shown in FIG. 1; FIG. 11 is a sectional view showing a portion of one example of a molded state in the manufacture of the QFN shown in FIG. 1; Of FIGS. 12A to 12C showing one example of the state of the matrix frame molded in the manufacture of the QFN shown in FIG. 1: FIG. 12A is an enlarged top plan view showing a portion; FIG. 12B is a sectional view taken along line A—A of FIG. 12A; and FIG. 12C is a sectional view taken along line B—B of FIG. 12A; FIG. 13 is a sectional view showing a portion of one example of the polished sate in which a sealing body is polished on its back face in the manufacture of the QFN shown in FIG. 1; FIG. 14 is a top plan view showing the example of the polished sate in which the sealing body is polished on its back face in the manufacture of the QFN shown in FIG. 1; and FIGS. 15A, 15B, 15C and 15D are sectional views showing portions of one example of a lead cutting procedure in the manufacture of the QFN shown in FIG. 1.

The semiconductor device of this embodiment, as shown in FIGS. 1 to 3, is of a small resin-sealed type and a surface mount type. This embodiment will be described by taking up a QFN (Quad Flat Nonleaded Package) 7 as one example of the semiconductor device.

On the other hand, the QFN 7 is a small-sized semiconductor package, as incorporated mainly into a mobile electronic device, and is of a surface mount, in which a plurality of leads 1a connected with a land 9a, i.e., substrate side terminals of a mount substrate 9 (as referred to FIG. 4) such as a printed-circuit board are arranged on the face of the semiconductor device mounting side (as will be called the "back face 3a") of a sealing body 3 made of a mold, as shown in FIG. 2.

Here, a semiconductor chip 2, as shown in FIG. 3, to be incorporated into the QFN 7 is a chip for a microcomputer or an ASIC (Application Specific Integrated Circuit), but should not be limited thereto.

Here will be described the construction of the QFN 7 (semiconductor device) of this embodiment with reference to FIGS. 1 to 4.

The QFN 7 is constructed to include: a tub 1e supporting the semiconductor chip 2 having a semiconductor integrated circuit formed on its principal face 2b; the sealing body 3 formed by sealing the semiconductor chip 2 with a resin; the plurality of leads 1a made of a copper alloy, arranged around the tub 1e, exposed to the back face 3a of the sealing body 3, and having a soldered or plated layer 8 formed at the exposed portion (or a mounted face 1d); and bonding wires 4 (or connecting members) connecting pads 2a or the surface electrodes of the semiconductor chip 2 with the corresponding leads 1a. As shown in FIG. 4C, two widthwise edge portions 1c, as exposed from the back face 3a of the sealing body 3, of the lead 1a are formed into rounded faces 1g, and the central portion, as including the rounded faces 1g, of the mounted face 1d of the lead 1a is protruded from the back face 3a of the sealing body 3.

Here, the protrusion of the lead 1a from the back face 3a of the sealing body 3 is achieved at a polishing step S4, as shown in FIG. 5, of a manufacture method of the QFN 7 by polishing the back face 3a of the sealing body 3 with a brush 10 which is made of a polyamide resin having abrasive gain adhered thereon, as shown in FIG. 13.

When the back face 3a of the sealing body 3 is polished with the brush 10 having abrasive grain, not only the resin of the back face 3a of the sealing body 3 but also the longitudinal edge portions 1c of the lead 1a are polished, as shown in FIG. 4C, so that the edge portions 1c become the rounded faces 1g.

By comparing the thickness ($T_1$) of the central portion of the lead 1a in the widthwise section of the lead 1a with the thickness ($T_2$) of the end portions of the lead 1a, therefore, the lead 1a can be formed to satisfy $T_1 > T_2$. After the polishing step, at a plating step S5 shown in FIG. 5, the mounted face 1d of the lead 1a is plated with solder so that the soldered layer 8 shown in FIG. 3 is formed on the mounted face 1d.

Here, the protrusion ($T_1 - T_2$) at the central portion is about 1 to 3 microns.

In the QFN 7 of this embodiment, on the other hand, the tub 1e has a thickness of about one half as large as that of the thickness of the lead 1a, as shown in FIG. 3.

Thus, at the time of manufacturing a matrix frame 1 (or lead frame) shown in FIG. 8, the back face 1h (as referred to FIG. 3) of the tub 1e is etched off so that a mold resin 15 shown in FIG. 11 can be arranged on the side of the back face 1h of the tub 1e, too, without elevating the position of the tub 1e with respect to the sealing body 3.

Since the vertical position of the tub 1e is unchanged in the QFN 7 shown in FIG. 3, therefore, the QFN 7 can be thinned, and the tub 1e is completely buried in the sealing body 3 so that the substrate can also be wired at positions on the lower side of the sealing body 3 in the mount substrate 9 when the QFN 7 is mounted on the mount substrate 9, as shown in the packaged mode of FIG. 4A. Here on the surface of the mount substrate 9, there is formed a solder resist 9b or an insulating film for covering the substrate wires.

In the QFN 7, on the other hand, the semiconductor chip 2 is supported by the tub 1e, which is exemplified in this embodiment by an X-shaped small cross tub, as shown in FIG. 9. In other words, the tub 1e is made far smaller in size than the semiconductor chip 2.

As a result, the semiconductor chips 2 of a plurality of kinds of sizes can be packaged on the tub 1e of one kind, and the contact area of the semiconductor chip 2 with the mold resin 15 on the side of its back side 2c can be enlarged to improve the contact between the semiconductor chip 2 and the sealing body 3 thereby to prevent the sealing body 3 and the semiconductor chip 2 from being separated.

In the QFN 7 of this embodiment, on the other hand, a lead burr 1i shown in FIG. 4B, as formed on the lead 1a at the step S6 of cutting the lead 1a, as shown in FIG. 5, is formed at the end portion on the upper side of the lead 1a, i.e., on the face of the lead 1a, as opposed to the mounted face 1d.

When the lead 1a is cut off the matrix frame 1 at the cutting step by the cutting punch 12a (or cutting blade) of a cutting die 12 shown in FIG. 15, it is pressed and cut with a shearing force by the cutting punch 12a from the side of its mounted face 1d of the lead 1a. As a result, the lead burr 1i is formed at the upper side end portion of the lead 1a.

On the other hand, the semiconductor chip 2 is given a thickness of about 0.2 to 0.3 mm, for example, and is fixed on the tub 1e with a die bond material 5 such as an epoxy adhesive.

On the other hand, the lead frame having the tub 1e and the lead 1a, i.e., the matrix frame 1 is made of a copper (Cu) alloy, an alloy (Fe—Ni) of iron and nickel or the like but is preferably made of the copper alloy.

Moreover, the matrix frame 1 has a thickness of about 0.09 to 0.21 mm, for example. Therefore, the tub 1e or the lead 1a has a similar thickness such as about one half as large as that of the lead 1a when the tub 1e is half-etched as in the QFN 7 of this embodiment.

Here, the matrix frame 1 should not be limited to the above-specified materials and thicknesses.

On the other hand, the bonding wire 4 (or the connecting member) for connecting the pad 2a of the semiconductor chip 2 with the corresponding lead 1a is made of a gold wire, for example.

Moreover, the sealing body 3 is formed by sealing it with a resin according to the molding method, and the used sealing mold resin 15 shown in FIG. 11 is a thermoset epoxy resin, for example.

Here, the sealing body 3 made of the mold resin 15 has a thickness of about 0.5 to 0.95 mm, for example.

On the other hand, the plated layer to be formed on the mounted face id of each lead 1a is the soldered layer 8 (Sn—Pb), for example, in this embodiment but may be another Sn solder such as a solder of Sn—Ag—Bi, a solder of Sn—Ag—Cu or a palladium (Pd) solder.

The plating thickness is 0.05 mm or less, for example, and is preferably about 0.01 mm.

Here, this plating thickness is the stand-off extent (or stand-off height) in the QFN 7.

Where the thickness of the sealing body 3 is about 0.5 to 0.95 mm and where the thickness of the soldered layer 8 is about 0.01 mm, for example, the height of the mount substrate 9 from the land 9a when the QFN 7 is packaged can be suppressed to 1.0 mm or less.

Figure 6C:
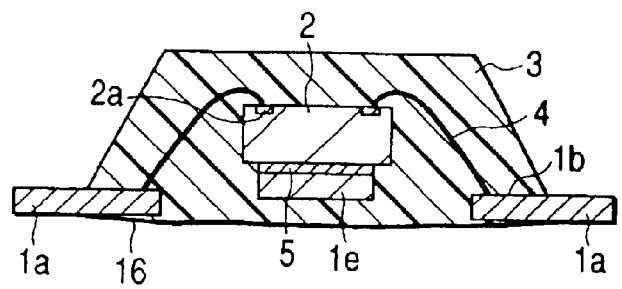
Figure 7:
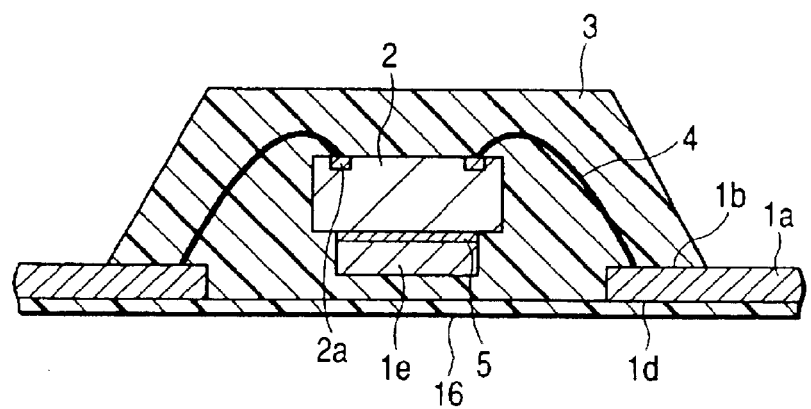
FIG. 7 is a sectional view showing one example showing the state in which a resin burr is formed on the back face of a sealing body after the molding step of the manufacture method of the QFN shown in FIG. 1.

According to the QFN 7 of this embodiment, by polishing the back face 3a of the sealing body 3 after the sealing body was formed by the resin mold, a resin burr 16 (of the leakage resin), as formed on the back face 3a of the sealing body 3 and shown in FIG. 6C, and the resin burr 16 (or the resin flash), as shown in FIG. 7, can be removed to expose the mounted face 1d of each lead 1a sufficiently. This makes it possible to expose the connection region of the lead 1a, as needed when the QFN 7 is mounted on the mount substrate 9, without fail.

In short, it is possible to retain the connection region of the lead 1a, as needed at the time of packaging the QFN 7.

As a result, the solder wettability can be improved to improve the connection reliability at the time when the QFN 7 is mounted on the mount substrate 9 or the like.

On the other hand, the flatness of the back face 3a of the sealing body 3 can be improved by polishing it thereby to improve the packageability of the QFN 7.

In the back face 3a of the sealing body 3, moreover, the rounded faces 1g are formed at the longitudinal edge portions 1c of the lead 1a, as shown in FIG. 4C, so that the thickness ($T_1$) of the central portion of the lead 1a in the widthwise section of the lead 1a can be made larger than the thickness ($T_2$) of the end portions of the lead 1a ($T_1 > T_2$).

As a result, the stand-off extent at the time of packaging the QFN 7 can be retained.

Since the widthwise central portion of the lead 1a is thicker than the end portions, more specifically, a solder paste 14 can run sufficiently to the rounded faces 1g at the widthwise end portions of the lead 1a, as shown in FIG. 4C, when the mount substrate 9 is soldered.

Therefore, solder fillets in the solder connection can be sufficiently formed to improve the connection reliability at the time of mounting the QFN 7 on the mount substrate 9.

In the QFN 7 of this embodiment, on the other hand, the lead burr 1i is formed on the upper side of the lead 1a, as shown in FIG. 4B.

As a result, the mounted face id of the lead 1a of the QFN 7 does not have lead burr 1i formed but is flat so that the packageability at the time when the QFN 7 is mounted on the mount substrate 9 and the connection reliability at the soldering time can be improved.

Since the matrix frame 1 is made of the copper alloy, on the other hand, its material cost can be lowered, and the heat radiation of the QFN 7 can be improved.

Therefore, it is possible to improve the reliability of the QFN 7.

On the other hand, the soldered layer 8 is formed as a plated layer on the mounted face 1d of the lead 1a of the QFN 7 so that the solder connectability at the time of mounting the QFN 7 on the mount substrate 9 can be improved.

Where the palladium plated layer is formed as the plated layer, the QFN 7 can be set free of lead when it is manufactured.

Next, the method of manufacturing the QFN 7 of this embodiment will be described with reference to the flow chart of the manufacture method shown in FIG. 5.

First of all, there is prepared the matrix frame 1 (or the lead frame), as shown in FIG. 8, which is made of the copper alloy with the plurality of leads 1a being arranged around the tub 1e capable of supporting the semiconductor chip 2.

Here in this matrix frame 1, unit lead frames 1j for the individual package regions are formed in a plurality of rows and a plurality of columns so that a number of QFNs 7 can be manufactured from one matrix frame 1. FIG. 9 shows the structure of the unit lead frame 1j of the matrix frame 1 of FIG. 8 in detail.

In the matrix frame 1 of this embodiment, on the other hand, of the plurality of leads 1a, the individual inner portions 1b of the adjoining leads 1a are separated in advance. After the resin molding step, the lead root end portions, as slightly protruding from the sealing body 3, are connected and supported by a frame portion if.

Here in the matrix frame 1, as shown in FIG. 8, a plurality of guide holes 1k are formed on the two side portions for providing guides at the transferring time and at the positioning time.

As shown in FIG. 9, moreover, at each unit lead frame 1j, the tub 1e is supported in four directions by tub suspending leads 11, and slits 1m are formed around the individual leads 1a for absorbing the stress.

After this, there is prepared the semiconductor chip 2 having the semiconductor integrated circuit formed on the principal face 2b. The semiconductor chip 2 is subjected to the die bonding (or chip mounting or pellet bonding) treatment at step S1.

Specifically, the tub 1e in each unit lead frame 1j of the matrix frame 1 and the semiconductor chip 2 are bonded.

At this time, the die bonding material 5 such as silver paste is applied to the tub 1e, as shown in FIG. 6A, to bond the tub 1e and the back face 2c of the semiconductor chip 2 through that die bonding material 5.

In other words, the semiconductor chip 2 is fixed over the tub 1e through the die bonding material 5 with its principal face 2b directed upward.

After this, there is performed a wire bonding treatment, as indicated at step S2.

First of all, the matrix frame 1 is set on a heat stage 17, as shown in FIG. 10, and the pads 2a of the semiconductor chip 2 and the inner portions 1b of the corresponding leads 1a are connected by the wires 4 of the gold line, as shown in FIG. 6B, by using a capillary 6 or a bonding tool.

At this time, in this embodiment, the pads 2a of the semiconductor chip 2 and the wires 4 are connected at first on the first bond side, and the wires 4 and the inner portions 1b of the leads 1a are then connected on the second bond side.

After this, a molding treatment is performed, as indicated at step S3. Here, the molding treatment is done by the transfer molding method.

At first, the wire-bonded matrix frame 1 (as referred to FIG. 10) is set on the upper part 11a of a mold die 11, as shown in FIG. 11, and is clamped by the upper part 11a and a lower part 11b. After this, the mold resin 15 is injected into a cavity 11c which is defined by the upper part 11a and the lower part 11b.

Here in the matrix frame 1 used in this embodiment, the individual inner portions 1b of the adjoining ones of the plurality of leads 1a are separated in advance. By resin-molding the semiconductor chip 2 and the wires 4 on the arranged side (although the back face 1h of the tub 1e is included) of the semiconductor chip 2 on the matrix frame 1, therefore, the plurality of leads 1a are arranged on the back face 3a to form the sealing body 3 with the individual inner portions 1b of the adjoining leads 1a being separate.

Therefore, the mold of this embodiment is the one-side mold which uses the upper part 11a having no recessed cavity 11c formed.

The mold resin 15 is set, when charged up, after lapse of a predetermined time period, and the mold is then opened to extract the matrix frame 1 from the mold die 11.

Here, FIGS. 12A, 12B and 12C show the states of the matrix frame 1 after molded. In the matrix frame 1 extracted from the mold die 11, as shown in FIGS. 12A and 12C, a residual resin such as a gate 18 or a runner 19 is formed together with the plurality of sealing bodys 3.

Here in the molded matrix frame 1, on the back face 3a of each sealing body 3, there are formed the resin burr 16 of the leakage resin, as shown in FIG. 6C, and the resin burr 16 of the resin flash, as shown in FIG. 7. At this stage, the connection region for the mounted faces id of the leads 1a is not sufficiently retained on the back face 3a of the sealing body 3.

After this, the polishing treatment is performed, as indicated at step S4. Specifically, the back face 3a of each sealing body 3 in the matrix frame 1 is polished to expose the mounted face 1d of each lead 1a sufficiently for retaining the connection region of the mounted face 1d sufficiently.

At this time, in this embodiment, the back side 3a of the sealing body 3 is polished with the brush 10, as made of the polyamide resin having the abrasive grain and as shown in FIG. 13, to expose the plurality of leads 1a to the outside.

Here, the brush 10 is made of the resin having the abrasive grain thereon and is preferably made of a polyamide resin. However, the brush 10 may be made of a nonwoven fabric and is borne turnably and slidably.

For this polishing treatment, the molded matrix frame 1 is set on a mask jig 21 which is attached to a polishing stage 20.

Here, the mask jig 21 is provided in a matrix arrangement with a plurality of through holes 21a according to the positions and sizes of the plurality of sealing bodys 3 of the matrix frame 1.

When the matrix frame 1 is set on the polishing stage 20, therefore, its face on the side having the sealing bodys 3 is directed downward, as shown in FIG. 13, so that the individual sealing bodys 3 are arranged in the individual through holes 21a of the mask jig 21 placed on the polishing stage 20.

As a result, the sealing bodys 3 have their back faces 3a directed upward on the polishing stage 20.

After this, an evacuation is made from the side of the back face 21b of the mask jig 21 to fix the matrix frame 1 on the mask jig 21.

Subsequently, the polishing treatment is performed by turning the brush 10 at a predetermined speed while discharging cooling water 23 from nozzles 22 to the back faces 3a of the individual sealing bodys 3 and simultaneously by moving the brush 10 in a predetermined direction.

Here in the moving locus of the brush 10, for example, the brush 10 is preferably moved so uniformly over the matrix frame 1 as to come into substantially homogeneous contact with the individual sealing bodys 3 of the matrix frame 1. In this embodiment, as shown in FIG. 14, the brush 10 is reciprocated, as indicated at 24, in parallel with the longitudinal direction of the matrix frame 1. However, the moving locus of the brush 10 should not be limited to that shown in FIG. 14 but may be any if it is homogeneous over the matrix frame 1.

During the movement, moreover, the brush 10 continuously applies a predetermined load to the back faces 3a of the individual sealing bodys 3 thereby to polish the back faces 3a.

Here, the abrasion of the back faces 3a of the sealing bodys 3 is about 1 to 3 microns, for example.

Figure 6D:
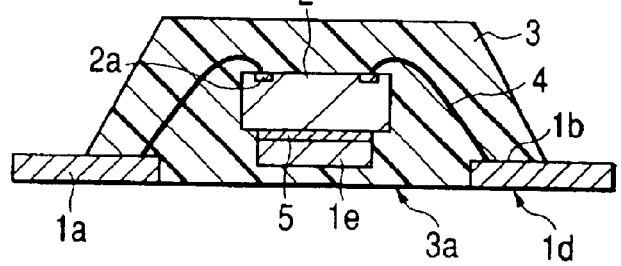

As a result, the resin burr 16, as shown in FIG. 6C or 7, can be removed to expose the mounted face 1d of each lead 1a so sufficiently on the back face 3a of the sealing body 3 as to retain the connection region, as shown in FIG. 6D.

By polishing with the brush 10 made of the polyamide resin having the abrasive grain, moreover, the mounted face 1d of the lead 1a can be so shaped that the longitudinal edge portions 1c of the lead 1a may be the rounded faces 1g, as shown in FIG. 4C. As a result, the thickness ($T_1$) of the central portion of the lead 1a in the widthwise section of the lead 1a can be made larger than that ($T_2$) of the end portions of the lead 1a ($T_1 > T_2$).

After this, there is performed the plating treatment, as indicated at step S5.

Figure 6E:
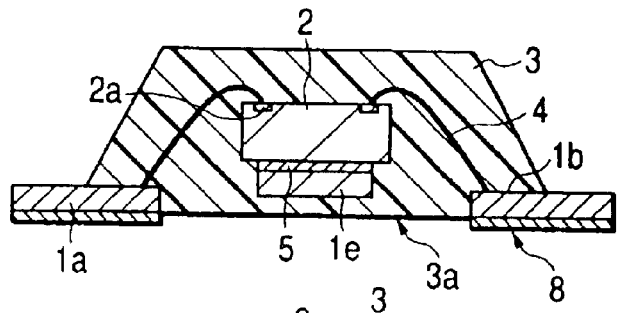
Figure 6F:
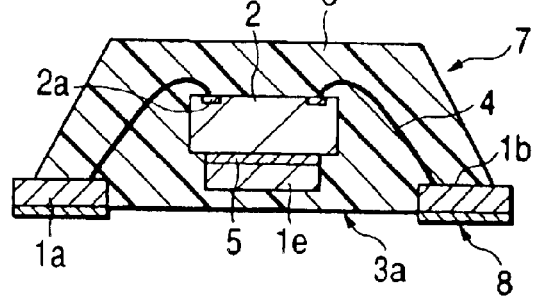

Specifically, the mounted face id of each lead 1a, as exposed from the back face 3a of the sealing body 3, is plated with the soldered layer 8 (or the plated layer), as shown in FIG. 6E.

At this time, the soldered layer 8 is formed by the electrolytic method, for example, to have a thickness of about 0.05 mm (at the maximum).

After this, there is performed the cutting treatment, as indicated at step S6.

Figure 15A:
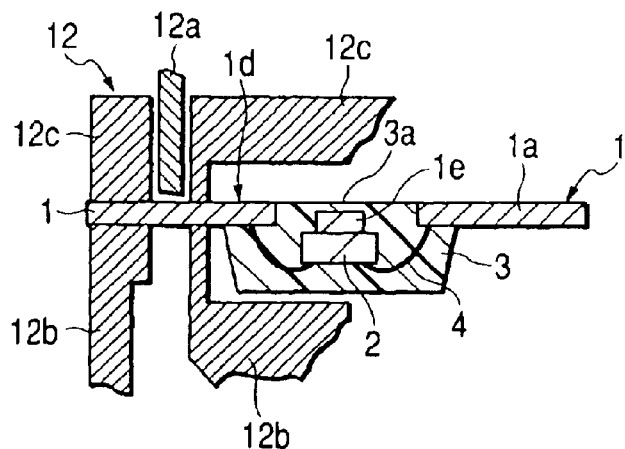
FIGS. 15A, 15B, 15C and 15D are sectional views showing portions of one example of a lead cutting procedure in the manufacture of the QFN shown in FIG. 1.

At the cutting step, as shown in FIG. 15A, the matrix frame 1 is placed on a lead cutting die 12b of the cutting die 12 with the back face 3a of the sealing body 3 being directed upward. Subsequently, the matrix frame 1 is clamped by the lead cutting die 12b and a stripper 12c.

Figure 15B:
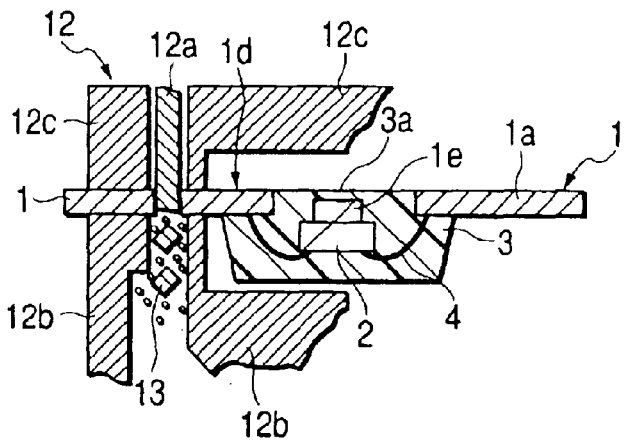

After this, as shown in FIG. 15B, the lead 1a is pressed (or given a shearing force) downward or from the side of the mounted face 1d by the cutting punch 12a (or cutting blade) of the cutting die 12 so that it is cut off the frame portion if, as shown in FIG. 9, of the matrix frame 1 so that the individual leads 1a are separated from the frame portion 1f.

Figure 15C:
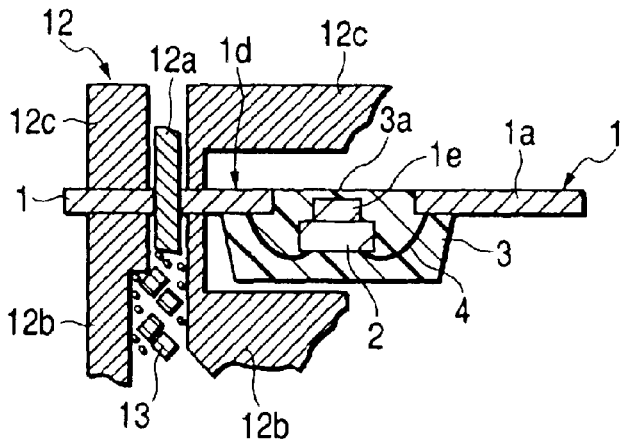
Figure 15D:
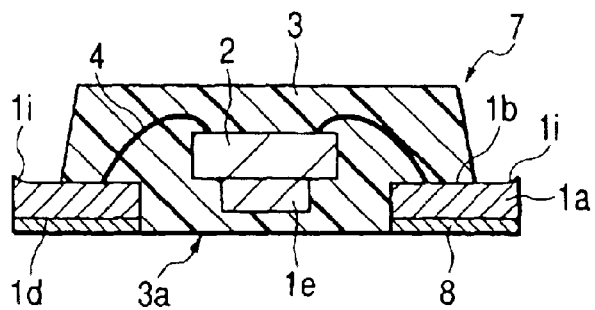

Here, by pressing the cutting punch 12a downward of the lead 1a, foreign substances such as cut chips 13 are enabled to fall down, as shown in FIG. 15C, and the lead burr 1i can be formed on the face of the lead 1a on the side opposed to the mounted face id, as shown in FIG. 15D and FIG. 4B.

Thus, there can be assembled the QFN 7, as shown in FIGS. 1 to 3 and FIG. 6F.

On the other hand, the packaged state of the completed QFN 7 on the mount substrate 9 is shown in FIG. 4.

According to the manufacture method of the QFN 7 (or the semiconductor device) of this embodiment, the resin burr 16, as formed on the back face 3a of the sealing body 3, can be removed by polishing the back face 3a of the sealing body 3 after the resin molding step so that the mounted face 1d of the lead 1a can be reliably exposed.

As a result, the connection region (or the plated region) on the mounted face 1d of the lead 1a at the time of packaging the QFN 7 can be retained to improve the connection reliability of the QFN 7.

Since the mounted face 1d of the lead 1a can be reliably exposed to the back face 3a by polishing the back face 3a of the sealing body 3 after the resin molding step, on the other hand, it is possible to manufacture even the QFN 7 of the large size (having 100 pins or more), although having been relatively difficult to manufacture.

By polishing the back face 3a of the sealing body 3 after the resin molding step, moreover, the resin burr 16 can be removed from the back face 3a. This makes it unnecessary to manage the pressure of the mold die 11, as might otherwise be caused by the resin burr 16 such as the resin flash, so that the method management in the molding step can be facilitated.

Since the resin burr 16 is removed from the back face 3a of the sealing body 3, on the other hand, the frequency to clean the mold die 11 can be reduced to improve the throughput of the molding step.

After the resin molding step, on the other hand, the mounted face 1d of the lead 1a can be reliably exposed to the back face 3a of the sealing body 3 by polishing the back face 3a so that the laminate molding method is not needed. This makes it unnecessary to modify the molding apparatus so that no cost is included for the modification.

Without the laminate molding method, moreover, the clamp is not made defective, as might otherwise occur at the lead clamping time for cutting the lead, so that the lead can be prevented from becoming defective.

Since the back face 3a of the sealing body 3 is polished by using the brush 10 made of the polyamide resin, on the other hand, the polishing treatment can be performed at an abrasion rate of about several microns according to the warpage (or deformation), if any, of the back face 3a of the sealing body 3.

As a result, the lead 1a can be exposed by polishing the back face 3a of the sealing body 3 while keeping the shape of its back face 3a.

Since the back face 3a of the sealing body 3 is polished by using the brush 10 made of the polyamide resin, on the other hand, the longitudinal edge portions 1c of the lead 1a on the back face 3a of the sealing body 3 can be formed into the rounded faces 1g, and the thickness ($T_1$) of the central portion of the lead 1a can be made larger than that ($T_2$) of the end portions of the lead 1a ($T_1 > T_2$).

As a result, the widthwise thickness of the central portion of the lead 1a is made larger than that of the end portions so that the solder paste 14 can run sufficiently to the rounded faces 1g at the widthwise end portions of the lead 1a, as shown in FIG. 4C, when the mount substrate 9 is soldered. As a result, the solder fillet at the soldered connection can be sufficiently formed to enhance the connection reliability at the time when the QFN 7 is mounted on the mount substrate 9 or the like.

At the cutting step of the lead 1a, on the other hand, the foreign substances such as the cut chips 13 can be dropped down by bringing the cutting punch 12a downward (from the side of the mounted face 1d) under the pressure into contact with the lead 1a.

As a result, the foreign substances such as the cut chips 13 can be efficiently collected to improve the working efficiency of the cutting step.

By bringing the cutting punch 12a downward (from the side of the mounted face id) under the pressure into contact with the lead 1a, on the other hand, the foreign substances go around to the face opposed to the mounted face id of the lead 1a so that the mounted face 1d can be set free of the foreign substances.

Thus, it is possible to improve the connection reliability at the time of packaging the QFN 7.

By bringing the cutting punch 12a downward (from the side of the mounted face 1d) under the pressure into contact with the lead 1a, moreover, the lead burr 1i can be formed on the faces, as opposed to the mounted face 1d, of the lead 1a.

As a result, the mounted face id of the lead 1a can be flatted without any burr to improve the connection reliably at the time of packaging the QFN 7 like before.

Although our invention has been specifically described in connection with its embodiments, it should not be limited to those embodiments but could naturally be modified in various manners without departing from the gist thereof.

In connection with the embodiments, for example, there has been described the technique for removing the resin burr 16 such as the leakage resin or the resin flash, as formed on the back face 3a of the resin-molded sealing body 3, by polishing the back face 3a. An effect other than that for removing the resin burr 16 (as referred to FIG. 6C) could be obtained, as exemplified in other embodiments shown in FIGS. 16 and 17.

Figure 16:
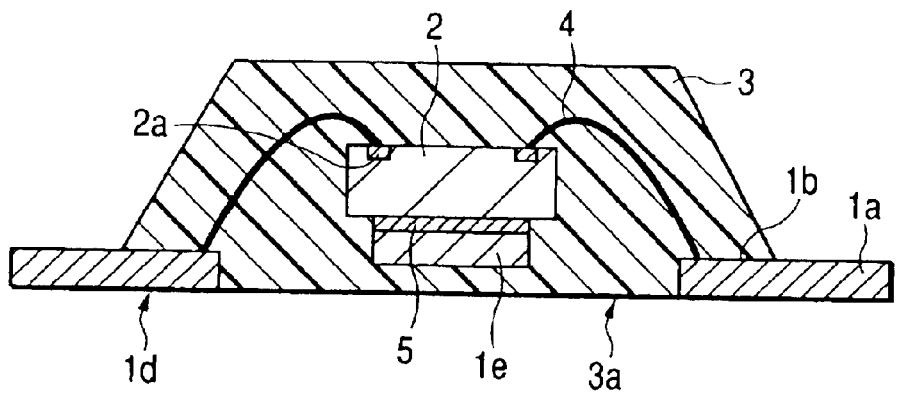
FIG. 16 is a sectional view showing a flatness correcting method according to an application of the semiconductor device manufacturing method of the invention.

In the embodiment of FIG. 16, more specifically, the flatness of the back face 3a of the resin-molded sealing body 3 is adjusted by polishing the back face 3a. As a result, the back face 3a can be cleared of the resin burr 16 and can be easily given a desired flatness.

Figure 17:
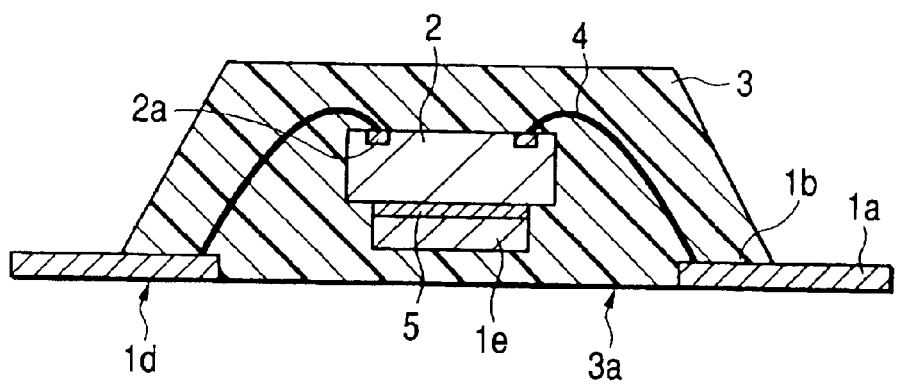
FIG. 17 is a sectional view showing a package thickness adjusting method according to an application of the semiconductor device manufacturing method of the invention.

In FIG. 17, moreover, the resin-molded sealing body 3 is thinned by polishing its back face 3a. As a result, the back face 3a can be cleared of the resin burr 16, and the QFN 7 (as referred to FIG. 1) can be made thinner.

By the semiconductor device manufacturing method according to the foregoing and other embodiments, therefore, it is possible to deburr the back face 3a of the QFN 7, to flatten the back face 3a and to thin the QFN 7.

Figure 18:
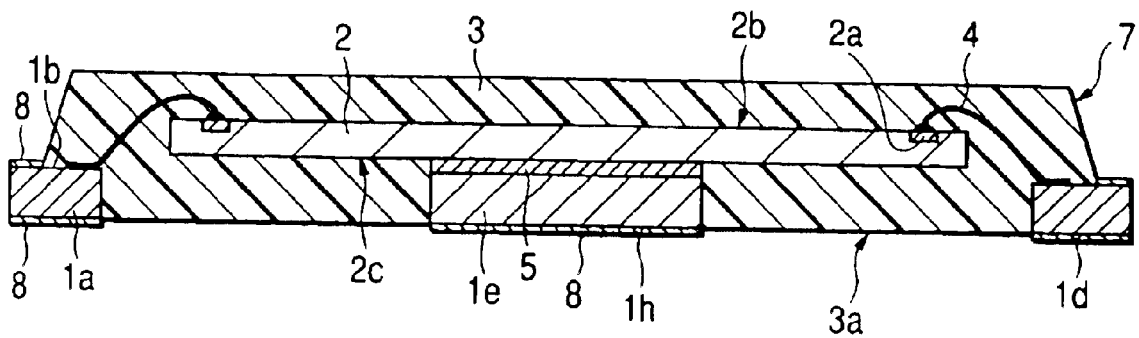
FIG. 18 is a sectional view showing a structure of a semiconductor device (QFN) according to another embodiment of the invention; and Of FIGS. 19A and 19B showing a molding method and a structure of a semiconductor device (QFN) to be compared with the semiconductor device of the invention.
Figure 19A:
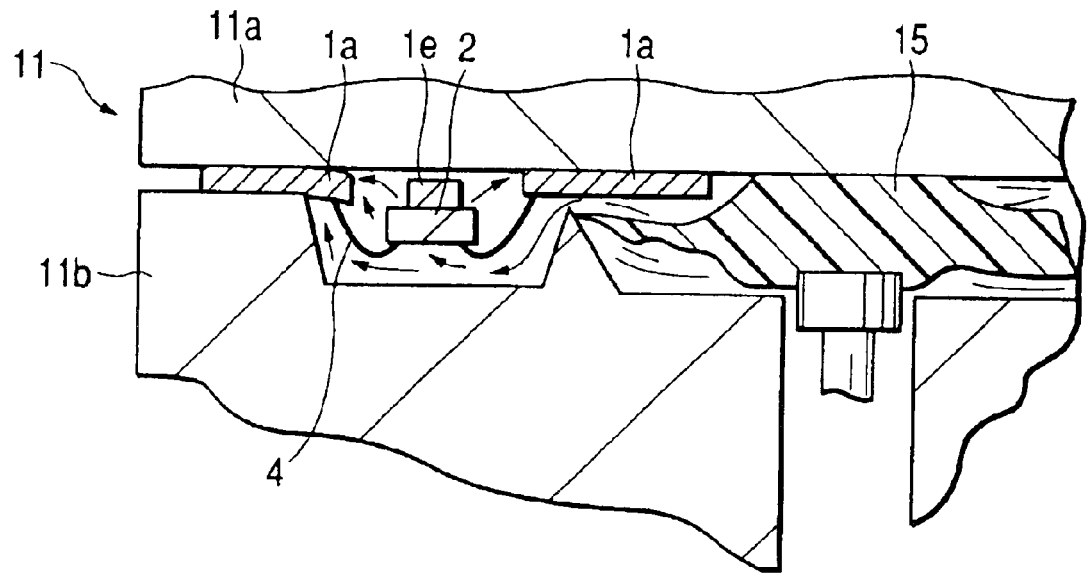
FIG. 19A is a sectional view showing a portion of a molding state.
Figure 19B:
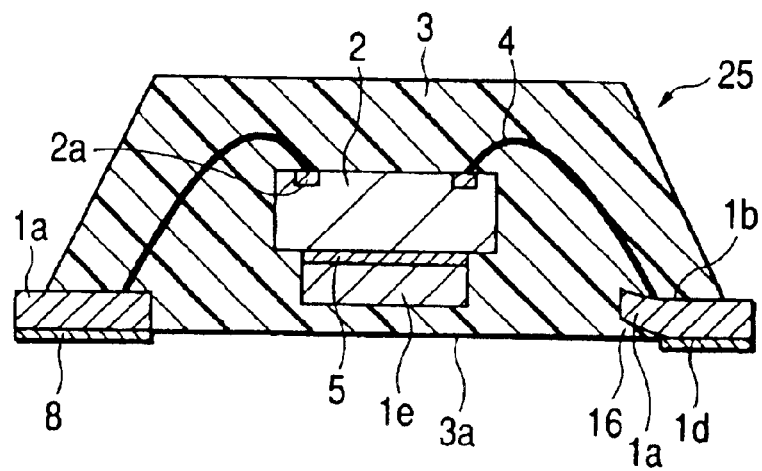
FIG. 19B is a sectional view of the QFN to be compared.

On the other hand, the foregoing embodiment has been described on the case in which the QFN 7 has the tub-buried structure. In another embodiment shown in FIG. 18, however, the QFN 7 may be modified into the tub-exposed structure in which the tub 1e is exposed to the back side 3a of the sealing body 3.

In this case, the back face 3a of the sealing body 3 is polished after molded with the resin, to expose the individual leads 1a and the tub 1e to the back face 3a of the sealing body 3. In the QFN 7 having the tub-exposed structure shown in FIG. 18, too, there can be attained an effect similar to that of the QFN 7 of the tub-buried structure, as has been described in connection with the foregoing embodiment.

Moreover, the foregoing embodiment has been described on the case in which the tub 1e is the X-shaped small cross tub. However, the shape of the tub 1e should not be especially limited but may be rectangular or circular.

Moreover, the tub 1e should not be limited to the small tub but may be of the type larger than the semiconductor chip 2.

On the other hand, the foregoing embodiment has been described on the case in which the lead frame is the matrix frame 1. However, the lead frame may be a series of unit lead frames 1j arranged in a row.

Moreover, the foregoing embodiment has been described on the case in which the back face 3a of the sealing body 3 is polished with the brush 10. However, the method of deburring the back face 3a of the QFN 7, flattening the back face 3a and thinning the QFN 7 may employ a grinding stop other than the brush 10.

On the other hand, the foregoing embodiment has been described on the case in which the lead 1a is press-cut by bringing the cutting blade (or the cutting punch 12a) under pressure from the side of the mounted face id of the lead 1a into contact. However, the cutting need not be performed from the side of the mounted face 1d but may be effected from the opposite side.

In the method of manufacturing the semiconductor device of the invention, moreover, the technique of polishing the back side of the sealing body 3 and the technique of cutting the lead 1a, as have been described in connection with the foregoing embodiment, may be performed both simultaneously or either solely.

Here, the foregoing embodiment has been described on the case in which the semiconductor device is the small-sized QFN 7. However, the semiconductor device may be any other than the QFN 7 if it is of the resin-sealed type and of the surface mount type in which it is assembled by using the lead frame.

The effects to be obtained by the representative invention disclosed herein will be briefly described in the following.

(1) By polishing the back face of the resin-molded sealing body, it is possible to remove the resin burr which is formed on the back face of the sealing body. As a result, the mounted face of the lead can be reliably exposed. Therefore, the connection region (or the plated region) can be retained on the mounted face of the lead at the time of packaging the semiconductor device. As a result, it is possible to improve the connection reliability of the semiconductor device.

(2) By polishing the back face of the resin-molded sealing body, it is possible to remove the resin burr which is formed on the back face of the sealing body. Therefore, the pressure management of the mold die, as might otherwise be caused by the resin burr such as the resin flash burr, can be eliminated to make it easy to manage the molding step.

(3) Since the mounted face of the lead can be reliably exposed by polishing the back face of the resin-molded sealing body, no laminate molding method is needed to require no modification of the molding apparatus so that no cost is involved for the modification. No laminate molding method is performed to cause no defect at the time of clamping the lead when the lead is cut, so that the lead cutting defect can be prevented.

(4) By polishing the back face of the sealing body with the brush made of the polyamide resin, the back face of the sealing body can be polished, even if deformed or warped, at the abrasion rate of about several microns according to the warpage of that back face.

(5) By polishing the back face of the sealing body with the brush made of the polyamide resin, the longitudinal edge portions of the lead on the back face of the sealing body can be formed into the rounded faces. Therefore, the widthwise central portion of the lead can be made thicker than the end portions so that the solder paste can run sufficiently to the rounded faces of the widthwise end portions of the lead when the mount substrate or the like is soldered. Therefore, the solder fillet in the solder connection can be sufficiently formed to enhance the connection reliability at the time of packaging the semiconductor device.

(6) At the cutting step of the lead, the foreign substances such as the cut chips can be dropped down by bringing the cutting blade downward under the pressure into contact with the lead. As a result, the foreign substances can be efficiently collected to improve the working efficiency of the cutting step.

(7) By bringing the cutting blade downward under the pressure into contact with the lead, the foreign substances go around to the face opposed to the mounted face of the lead so that the mounted face can be set free of the foreign substances. Therefore, it is possible to improve the connection reliability at the time of packaging the semiconductor device. Moreover, the lead burr can be formed on the upper side of the lead thereby to improve the connection reliability at the time of packaging the semiconductor device.

What is claimed is:

1. A method of manufacturing a semiconductor device, comprising the steps of:

providing a lead frame having a front face, a back face opposed of the front face, a tub and a plurality of leads arranged around the tub wherein a back face of the tub is etched off and each of the leads is thicker than the tub;

providing a semiconductor chip having a principal face, a back face and a plurality of electrodes formed on the principal face;

bonding the back face of the semiconductor chip on the front face of the tub;

electrically connecting the plurality of electrodes with the plurality of leads via a plurality of wires, respectively;

providing a molding die having an upper part and a lower part wherein the lower part has a cavity;

arranging the lead frame between the upper part and the lower part as the bonded semiconductor chip is positioned in the cavity of the lower part and the back face of the tub is facing the upper part; and after the arranging step, injecting a resin in the cavity for sealing the semiconductor chip, the tub, the plurality of wires, and a part of each of the plurality of leads in the resin, wherein the back face of the tub is entirely sealed by the resin, and wherein a part of the resin which covers the back face of the tub is thinner than the leads.

2. A method of manufacturing a semiconductor device, comprising the steps of:

providing a lead frame having a front face, a back face opposed of the front face, a tub and a plurality of leads arranged around the tub wherein a back face of the tub is etched off and each of the leads is thicker than the tub;

providing a semiconductor chip having a principal face, a back face and a plurality of electrodes formed on the principal face;

bonding the back face of the semiconductor chip on the front face of the tub;

electrically connecting the plurality of electrodes with the plurality of leads via a plurality of wires, respectively;

providing a molding die having an upper part and a lower part wherein the lower part has a cavity;

arranging the lead frame between the upper part and the lower part as the bonded semiconductor chip is positioned in the cavity of the lower part and the back face of the tub is facing the upper part; and after the arranging step, injecting a resin in the cavity for sealing the semiconductor chip, the tub, the plurality of wires, and a part of each of the plurality of leads in the resin, wherein the back face of the tub is entirely sealed by the resin, and wherein a front face of the tub is smaller than the back face of the semiconductor chip.

3. A method of manufacturing a semiconductor device according to claim 2, wherein the lead frame has a frame portion and tub suspending leads, the plurality of leads are supported with the frame portion, and the tub is supported with the frame portion via the tub suspending leads.

4. A method of manufacturing a semiconductor device according to claim 3, wherein the tub suspending leads are connected to the tub under the back face of the semiconductor chip.

5. A method of manufacturing a semiconductor device according to claim 4, wherein back faces of the tub suspending leads at portions that connect the tub are etched off.

6. A method of manufacturing a semiconductor device according to claim 5, wherein back faces of the tub suspending leads at portions under the back face of the semiconductor chip are etched off.

7. A method of manufacturing a semiconductor device according to claim 6, wherein, in the resin injecting step, back faces of the tub suspending leads at portions of etched off are sealed by the resin.

8. A method of manufacturing a semiconductor device according to claim 7, wherein, in the resin injecting step, injecting the resin between front faces of the tub suspending leads and the back face of the semiconductor chip under the back face of the semiconductor chip.

9. A method of manufacturing a semiconductor device according to claim 8, wherein a part of the resin which covers the back face of the tub is thinner than the leads.

10. A method of manufacturing a semiconductor device according to claim 9, wherein a part of the resin which covers the back faces of the tub suspending leads is thinner than the leads.

* * * * *